United States Patent [19]

Gambini

[11] Patent Number: 4,918,700
[45] Date of Patent: Apr. 17, 1990

[54] METHOD AND DEVICE FOR AUTOMATIC FREQUENCY CONTROL OF SEMICONDUCTOR LASERS

[75] Inventor: Piero Gambini, Turin, Italy

[73] Assignee: Cselt - Centro Studi e Laboratori Telecomunicazioni S.P.A., Turin, Italy

[21] Appl. No.: 328,439

[22] Filed: Mar. 24, 1989

[30] Foreign Application Priority Data

Mar. 31, 1988 [IT] Italy .............................. 67288 A/88

[51] Int. Cl.$^4$ ........................... H01S 3/13; H01S 3/00
[52] U.S. Cl. ..................................... 372/32; 372/38; 372/26; 372/29; 372/28
[58] Field of Search .................. 372/32, 29, 38, 26, 372/28

[56] References Cited

U.S. PATENT DOCUMENTS

| 4,583,228 | 4/1986 | Brown et al. | 372/32 |
| 4,709,417 | 11/1987 | Kuwabara | 372/32 |
| 4,827,116 | 5/1989 | Takagi et al. | 372/38 |

FOREIGN PATENT DOCUMENTS

| 0052891 | 3/1983 | Japan | 372/32 |
| 0035588 | 2/1985 | Japan | 372/32 |
| 0043385 | 2/1988 | Japan | 372/32 |

Primary Examiner—William L. Sikes
Assistant Examiner—Georgia Y. Epps
Attorney, Agent, or Firm—Herbert Dubno

[57] ABSTRACT

In a method for the automatic frequency control of semiconductor kasers, the signal emitted from the laser (1) is sent to an optical resonator (6) whose resonance frequency is modulated by a ramp signal, the signal outgoing from the resonator (6) is converted into an electrical signal, the derivative of such an electrical signal is calculated, the zero crossing of the derivative is detected, the ramp signal is sampled in corresponding with such a zero crossing, and the sample thus obtained is algebraically summed to a reference signal depenent on the nominal laser emission frequency, thus obtaining an error signal which is sent to devices (3) driving the laser (1). In case of a plurality of lasers ($1a$ ... $1n$) the signals of which are wavelength multiplexed, the rame signal is sampled in correspondence with the derivative zero crossings corresponding with the emission frequencies of the individual lasers ($1a$ .. $1n$), and the samples thus obtained are compared with respective reference signals, obtaining a control signal for each laser.

A device for implementing the method is also supplied (FIG. 1).

6 Claims, 4 Drawing Sheets

METHOD AND DEVICE FOR AUTOMATIC FREQUENCY CONTROL OF SEMICONDUCTOR LASERS

FIELD OF THE INVENTION

The present invention relates to semiconductor lasers, and more particularly, to a method and a device for automatic frequency control of such lasers.

BACKGROUND OF THE INVENTION

It is known that the emission frequency of a semiconductor laser undergoes fluctuations, dependent in particular on temperature variations in the active region. In a number of applications, e.g. coherent communications on optical fiber, such fluctuations must be controlled within rather narrow limits, and hence such lasers are associated with devices for automatic frequency control.

The most widely used control devices uses Fabry-Perot interferometers as frequency discriminators, associated with electronic circuits generating error signals used to control laser injection current or temperature. An example is described in the paper entitled "Frequency stability measurements of feedback stabilized AlGaAs DH lasers" by H. Tsuchida, S. Sanpei, M. Ohtsu, T. Tako, Japanese Journal of Applied Physics, Vol. 19, No. 12, Dec. 1980, pages L721–L724. In this device, a photomultiplier collects the beam emitted from the laser after such beam has been made to pass through a high stability Fabry-Perot interferometer, whose length is piezoelectrically modulated by a sinusoidal signal; a lock-in amplifier generates the first derivative of the interferometer spectrum by detecting the photomultiplier output signal synchronously with the modulating oscillation. Such a derivative becomes zero when the emission frequency is the nominal one, and is different from zero in the other cases. Thus an error signal is obtained, which consists in of the instantaneous value of the derivative in its linear portion, and such a signal is used to control the laser temperature.

This known system has a number of drawbacks. The scanning carried out by the interferometer is very short (and actually it corresponds to the portion of the photodetector output peak comprised between the two inflexion points). As a consequence there is a very small range in which frequency locking occurs and hence the system has a limited correction capability. Besides, if the laser linewidth or emitting power changes, the slope of the involved curve portion changes too; that affects the control system performance. Owing to the interferometer length modulation technique, the signal derivative can be obtained only by the use of expensive means, such as a lock-in amplifier. Lastly, this known system cannot be used to control a plurality of sources, as can be required in a multichannel transmission system. In effect, the technique adopted for generating the error signal, according to which a small frequency range about the maximum of the photomultiplier output peak is examined does not allow the analysis of a sequence of peaks having the frequency spacing required by such systems.

As to the latter problem, the article entitled "Optical FDM transmission technique" by K. Nosu, H. Toba and K. Ivashita, Journal of Lightwave Technology", Vol. Lt-5, No. 9, Sept. 1987, pages 1301–1308, discloses a device for the automatic frequency control of a plurality of lasers, used as sources in a frequency division multiplex optical communications system. In this device the heats are generated between the output signal of one of the lasers, stabilized in a conventional way and used as reference, and the signals emitted by the other lasers; the central heat frequencies are determined by a Fabry-Perot interferometer, and the information thus obtained is converted into digital electrical signals from which, after conversion into analog form, control signals for the other lasers are obtained. The known device is very complicated since it requires two stabilizing systems, one for the laser used as reference and the other for the remaining lasers; besides, since stabilization of said remaining lasers depends on that of the reference laser, the system performance depends on the reference stabilization precision.

OBJECT OF THE INVENTION

It is an object of the invention to provide an improved, which, owing to the technique adopted for the interferometer modulation necessary for the spectral analysis, do not require the use of expensive apparatus; can supply a control independent of linewidth and power; can allow even wide frequency oscillations to be compensated; and can be applied for controlling a plurality of lasers without depending on the good stabilization of one of them and without needing a double control system.

SUMMARY OF THE INVENTION

According to a first aspect of the invention, a method for the automatic frequency control of a semiconductor laser is provided, wherein a spectral analysis of the light signals emitted by the laser is effected, the signals representative of the spectrum are converted into electrical signals, the derivative of such electrical signals is generated, and an error signal is extracted from that derivative and is sent to laser driving devices. According to the invention, the spectral analysis is controlled by a ramp voltage signal, and in that: the zero crossing of the derivative within a ramp period is detected, said zero crossing identifying the actual emission frequency of the laser; the ramp signal is sampled in correspondence with the zero crossing of the derivative; and the sample obtained in algebraically summed with a reference signal dependent on the nominal emission frequency of the laser, the signal resulting from the algebraic sum forming said error signal.

According to a second aspect of the invention, there is provided a method for the automatic frequency control of a light signal source comprising a plurality of semiconductor lasers whose emissions are frequency multiplexed, wherein a spectral analysis of the light signals emitted by the source is effected, the signals representative of the spectrum are converted into electrical signals, the derivative of such electrical signals is determined, and an error signal for each laser is obtained from the derivative and is sent to means driving the respective laser. According to the invention, the spectral analysis is controlled by a ramp voltage signal, and the derivative zero crossings in a ramp period are detected, said zero crossings identifying each the actual emission frequency of one of the lasers; the ramp signal is sampled in correspondence with each zero crossing of the derivative; and each sample obtained is algebraically added to a respective reference signal dependent on the nominal emission frequency of the respective laser, the signals resulting from the algebraic sums forming said error signals.

The device for carrying out the method of the first aspect of the invention comprises means for effecting the spectral analysis of the signals emitted by the source and for supplying electrical signals representative of the spectrum, means for calculating the derivative of said electrical signals and means for obtaining from said derivative an error signal for the laser, and wherein the means for the spectral analysis is controlled by a ramp voltage signal generator; the derivative calculating means consists of a differentiating circuit; and the means for obtaining the error signal comprises: a circuit detecting the zero crossing of the derivative signal within a ramp signal period; a pulse generator generating a pulse in correspondence with the detection of the derivative zero crossing; means, controlled by said pulse generator, for sampling the ramp signal in correspondence with the derivative zero crossing; and means for algebraically summing the ramp signal sample and a reference signal dependent on the nominal emission frequency of the laser, the output signal of the summing means forming the error signal.

The device for carrying out the method of the second aspect of the invention comprises means for effecting the spectral analysis of the signals emitted by the source and for supplying electrical signals representative of the spectrum, means for calculating the derivative of said electrical signals and means for obtaining from said derivative an error signal for each laser. The means for the spectral analysis is controlled by a ramp voltage signal generator; the derivative calculating means consists of a differentiating circuit; and the means for obtaining the error signal comprises a circuit detecting the zero crossings of the derivative in a period of the ramp signal; a pulse generator generating a pulse in correspondence with the detection of each zero crossing of the derivative, each pulse being relative to one of the lasers; a plurality of samplers, controlled by said pulse generator, each of which is associated with one of the lasers and samples the ramp signal in correspondence with the zero crossing of the derivative corresponding to the emission frequency of the associated laser; and a plurality of adding circuits, each connected to one of the sample-andhold circuits, for algebraically adding the samples of the ramp signal with a respective reference signal depending on the nominal emission frequency of the associated laser, the signal outgoing from each adding circuit forming the error signal for the associated laser.

BRIEF DESCRIPTION OF THE DRAWING

For a better understanding of the invention, reference is made to the annexed drawings, in which.

DETAIL DESCRIPTION

Figure 1:
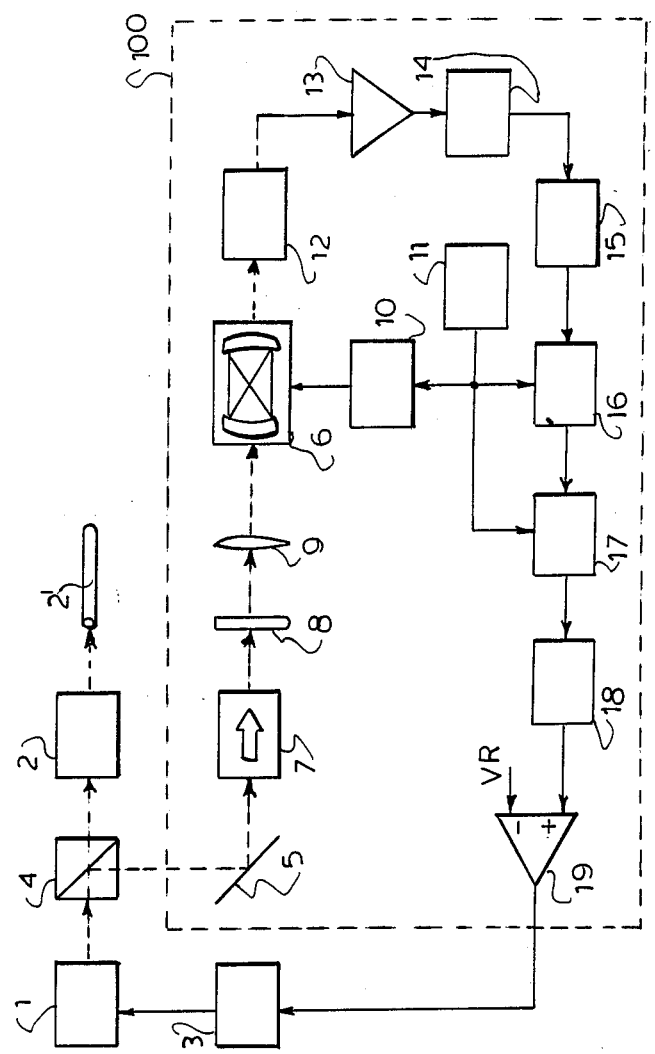
FIG. 1 is a diagram of the device according to the invention for controlling a single source.

FIG. 1 shows the device according to the invention used to adjust the injection current of a semiconductor laser 1 used as a signal source in an optical communications system, of which only modulator 2 and optical fiber transmission line 2' are shown.

The optical signal paths are represented by dotted lines, and the electrical signal paths are represented by solid lines. Laser 1 is e.g. a distributed feedback laser. Such lasers are particularly suitable for use in coherent communications systems, thanks to their linewidth characteristics. The usual temperature control devices are incorporated into block 1; reference numeral 3 denotes the injection current source.

The optical signal emitted by laser 1 is sent, through an optical system schematized by beam splitter 4 and mirror 5, towards both modulator 2 and the control device, generally shown at 100.

As in the prior art systems, the beam directed to control device 100 is sent to a frequency discriminator or spectrum analyzer 6, consisting of a Fabry-Perot scanning interferometer, through an optical insulator 7, an attenuator 8, and a possible focusing optical system, schematized by lens 9. The distance between the mirrors of interferometer 6 is modified by a piezoelectric device 10 fed by a ramp voltage, supplied by generator 11. In this way, interferometer resonance frequency linearly depends on the voltage applied. The ramp will advantageously have such characteristics as to cause an interferometer length variation up to the so called free spectral range of the interferometer.

At the output from interferometer 6, a detector 12 converts the optical signals into electrical signals and supplies them, through amplifier 13, to a differentiating circuit 14 which calculates the derivative thereof. Compactor 15 detects the zero crossing point of the derivative signal, which point identifies the actual central emission frequency of the laser, and emits a signal indicating such detection. Such a signal is converted by pulse generator 16 into a short pulse which is applied to a control input of a sample-and-hold circuit 17, receiving also the ramp signal emitted by generator 11, duly attenuated.

The ramp signal is thus sampled in correspondence with the zero crossing of the interferometer spectrum derivative. The samples emitted from circuit 17 are filtered in a low-pass filter 18, with time constant much longer than the sampling period of sample-and-hold circuit 17, and are compared in a differential amplifier 19 with a reference signal VR dependent on the nominal oscillation frequency of the laser.

The signal outgoing from amplifier 19 is the error signal which is supplied to injection current source 3 to change the current so as to compensate the emission frequency fluctuations.

Figure 2:
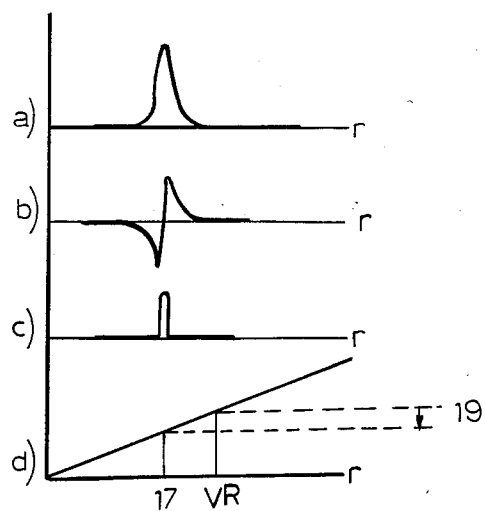
FIG. 2 shows the shape of the signals outgoing from a number of blocks of FIG. 1.

FIG. 2 shows the shape of some signals of interest within a ramp signal period: curve (a) is the signal outgoing from detector 12; curve (b) is the derivative of signal (a) ; (c) is the sampling pulse; lastly sketch (d) shows the generation of the ramp signal sample (denoted by 17) and of the error signal, denoted by 19, as a result of the comparison with reference signal VR.

From the preceding description it is easy to deduce that the circuit according to the invention eliminates the drawbacks of the prior art. More particularly, recognition of the derivatives zero crossing in order to identify the central laser frequency renders the system performance independent of linewidth and power, which affect the derivative slope; no expensive apparatus is required, since the derivative is obtained by a simple differentiating circuit; lastly, by a suitable choice of the ramp characteristics, the interferometer can carry out a scanning whose amplitude reaches the so-called free spectral range.

Figure 3:
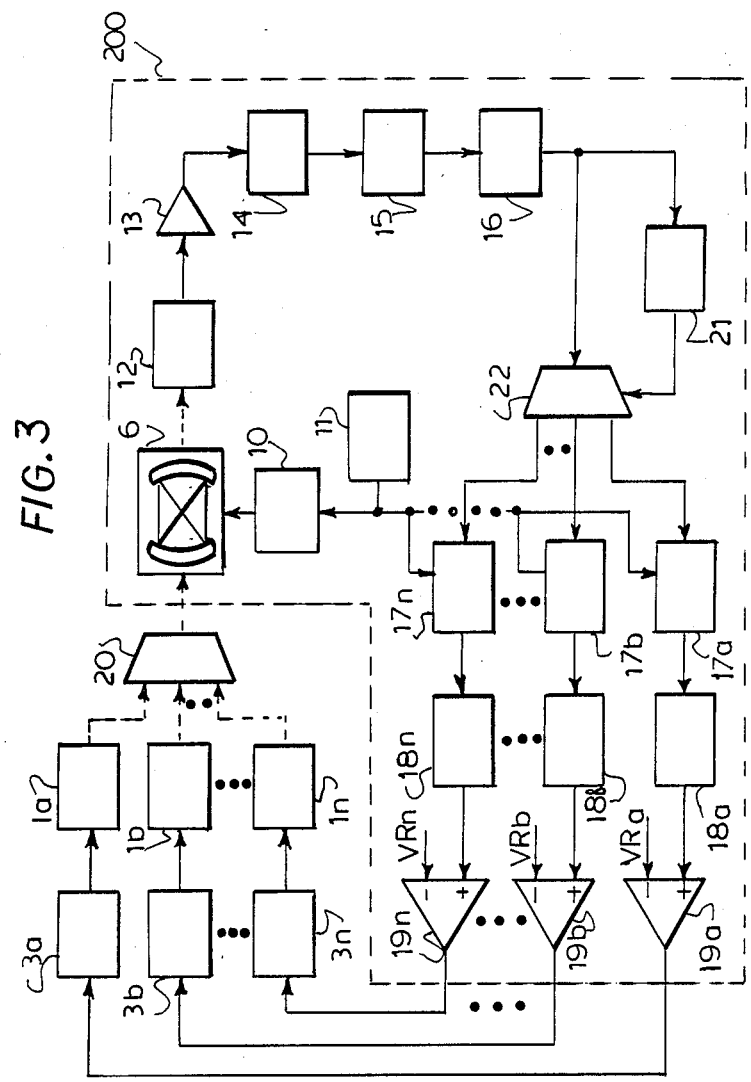
FIG. 3 is a diagram of the device for controlling a plurality of sources.

FIG. 3 shows an embodiment of the invention for the automatic frequency control of a plurality of lasers 1a, 1b...1n, each having its own emission frequency established by the corresponding injection current source 3a, 3b...3n. The signals emitted by lasers 1a, 1b...1n are sent to a coupler 20 generating a single beam used in a frequency division optical communications system (not shown). In this Figure, the control device is denoted as a whole by 100 and the devices present also in the embodiment of FIG. 1 are denoted by the same references characters. For drawing simplicity the elements upstream of interferometer 6 have not been represented.

Figure 4:
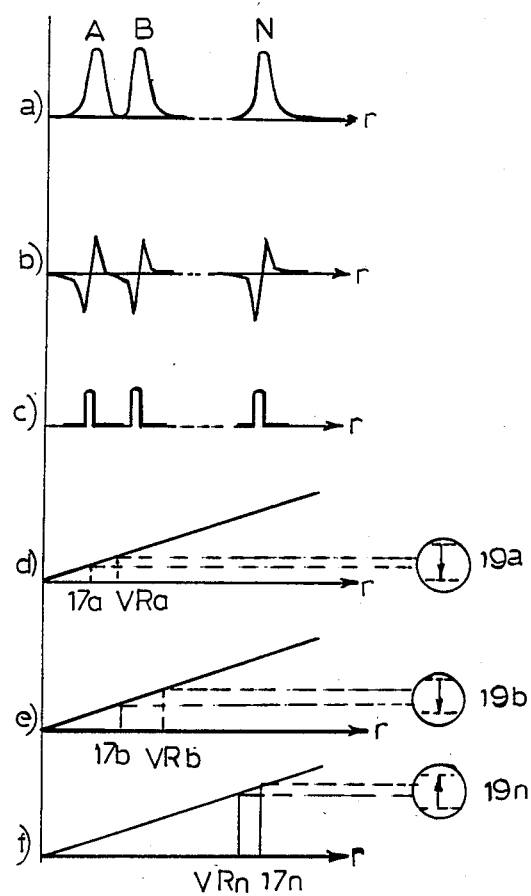
FIG. 4 is a diagram similar to FIG. 1, relevant to the embodiment of FIG. 3.

In control device 200, as in device 100, interferometer 6 is modulated by ramp generator 11 through piezoelectric device 10, and is followed by detector 12, amplifier 13, differentiating circuit 14, comparator 15 and pulse generator 16. Yet in this case, since the beam sent to interferometer 6 comprises a plurality of frequencies, the signal outgoing from detector 12 will present, within a ramp signal period, a sequence of peaks (FIG. 4a), each corresponding to the spectral line of one of lasers 1a, 1b...1a. Similarly, the output signal of differentiating circuit 14 will comprise a sequence of waveforms (FIG. 4b) similar to that of FIG. 2b. Comparator 15 will supply a signal indicative of the zero crossing of each of the wave-forms of FIG. 4b, and pulse generator 16 will supply a pulse (FIG. 4c) at each leading edge of the signal outgoing from comparator 15. Obviously, care must be taken that the signal emitted by the comparator has basically the same duration as the derivative of each peak, to avoid the emission of spurious pulses in correspondence with the return to 0 of the waveforms of FIG. 4b.

Pulse generator 16 is connected to a counter 21, counting the pulses emitted by generator 16, and to a demultiplexer 22, receiving as control signal the output signal of counter 21. Demultiplexer 22 has n outputs connected each to a corresponding sample-and-hold circuit 17a, 17b...17n and, depending on the count of counter 21, transfers onto one of such outputs the pulse present at its input. E.g., supposing that peaks A, B,...N in FIG. 4a correspond with the emission lines of lasers 1a, 1b...1n, respectively, the first pulse emitted by generator 16 will be supplied to sample-and-hold circuit 17a as a sampling pulse, the second to circuit 17b, and so on until the last pulse, which will be supplied to circuit 17n.

Circuits 17a, 17b...17n are all connected to ramp generator 11 and they sample the ramp at the instant indicated by the corresponding sampling pulse. As in circuit 100 of FIG. 1, each sample is filtered in a respective low pass filter 18a, 18b...18n and compared, in differential amplifier 19a, 19b...19n, with respective reference voltage VRa, VRb...VRn. The error signals (FIGS. 4d, 4e, 4f) to be applied to injection current sources 3a, 3b...3n of the individual lasers are thus obtained.

The embodiment of the invention employed to control a plurality of sources has the advantages described in connection with FIG. 1 as to operation flexibility, performance and electronic circuit simplicity. In addition, the lasers are controlled independently of one another, so that the system performance do not depend on the good stabilization of one of them, taken as a reference; finally, two stabilization circuits of different type demanding each its frequency discriminator are not required.

I claim:

1. A method for the automatic frequency control of a semiconductor laser, wherein a spectral analysis of the light signals emitted by the laser is effected, the signals representative of the spectrum are converted into electrical signals, the derivative of such electrical signals is determined, and an error signal is obtained from the derivative and is sent to means driving the laser, said method comprising the steps of controlling said spectral analysis by a ramp voltage signal; detecting the derivative zero crossing in a ramp period, the zero crossing identifying the actual emission frequency of the laser; and sampling the ramp signal in correspondence with the zero crossing of the derivative, and adding the sample obtained algebraically to a reference signal dependent on the nominal emission frequency of the laser, the signal resulting from the algebraic sum forming said error signal.

2. A method for the automatic frequency control of a light signal source comprising a plurality of semiconductor lasers whose emissions are frequency multiplexed, wherein a spectral analysis of the light signals emitted by the source is effected, the signals representative of the spectrum are converted into electrical signals, the derivative of such electrical signals is determined, and an error signal for each laser is obtained from the derivative, which error signal is sent to means driving the respective laser, the method comprising the steps of controlling said spectral analysis by a ramp voltage signal; detecting the derivative zero crossings in a ramp period, said zero crossings identifying each the actual emission frequency of one of the lasers; and sampling the ramp signal in correspondence with each zero crossing of the derivative, and adding each sample obtained algebraically to a respective reference signal dependent on the nominal emission frequency of the respective laser, the signals resulting from the algebraic sums forming said error signals.

3. In a device for the automatic frequency control of a semiconductor laser, comprising means for the spectral analysis of the signals emitted by the laser, a photodetector converting the signals outgoing from the spectral analysis means into electrical signals, means calculating the derivative of such electrical signals, and means obtaining from said derivative an error signal which is sent to laser driving means, the improvement wherein: the spectral analysis means are controlled by a ramp voltage signal generator; the derivative computing means consists of a differentiating circuit; and the means for obtaining the error signal comprises a circuit for detecting the zero crossing of the derivative signal in one period of the ramp signal, a pulse generator generating a pulse in correspondence with the detection of the zero crossing of the derivative, a sampler, controlled by said pulse generator, for sampling the ramp signal in correspondence with the zero crossing of the derivative, and means for algebraically adding the sample of the ramp signal and a reference signal (VR) depending on the nominal emission frequency of the laser, the signal outgoing from the adding means (19) forming the error signal.

4. In a device for the automatic frequency control of a light signal source comprising a plurality of semiconductor lasers whose emissions are frequency multiplexed, comprising means for the spectral analysis of the signals emitted by said source, a photodetector converting the signals outgoing from the spectral analysis means into electrical signals, means calculating the derivative of such electrical signals and means obtaining from said derivative an error signal for each laser, which error signals are sent to respective laser deriving means, the improvement wherein: the spectral analysis means are controlled by a ramp voltage signal generator; the derivative computing means consists of a differentiating circuit; and the means for obtaining the error signal comprises: a circuit for detecting the zero crossings of the derivative signal in one period of the ramp signal, said zero crossings identifying each the actual emission frequency of one of the lasers; a pulse generator generating a pulse in correspondence with the detection of each zero crossing of the derivative, each pulse being relative to one of the lasers; a plurality of samplers, each associated with one of the lasers and sampling the ramp signal in correspondence with the zero crossing of the derivative relative to the associated laser; and a plurality of adding circuits, each connected to one of the samplers, for algebraically adding the samples of the ramp signal with a respective reference signal (VRa...VRn) depending on the nominal emission frequency of the associated laser, the signal outgoing from each adding circuit forming the error signal for the associated laser.

5. A device according to claim 4, wherein means are provided between the pulse generator and the samplers for sending the individual pulses emitted by the generator to the sampler associated with the laser a pulse refers to.

6. A device according to claim 3, wherein the ramp signal generator causes a scanning of the spectral analysis means equal to the free spectral range of said means.

* * * * *